United States Patent
Berthold et al.

(10) Patent No.: US 7,411,423 B2
(45) Date of Patent: Aug. 12, 2008

(54) LOGIC ACTIVATION CIRCUIT

(75) Inventors: Jörg Berthold, Munich (DE); Georg Georgakos, Fraunberg (DE); Stephan Henzler, Munich (DE); Doris Schmitt-Landsiedel, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 248 days.

(21) Appl. No.: 11/194,495

(22) Filed: Aug. 1, 2005

(65) Prior Publication Data
US 2006/0022712 A1 Feb. 2, 2006

(30) Foreign Application Priority Data
Jul. 30, 2004 (DE) .................. 10 2004 036 956

(51) Int. Cl.
*H03K 19/096* (2006.01)
(52) U.S. Cl. .................... 326/98; 326/95; 326/113
(58) Field of Classification Search .............. 326/81, 326/83, 85, 95, 98, 113
See application file for complete search history.

(56) References Cited

U.S. PATENT DOCUMENTS

| | | | | |
|---|---|---|---|---|
| 6,064,223 A | | 5/2000 | Lu et al. | |
| 6,118,328 A | * | 9/2000 | Morikawa | 327/534 |
| 6,476,641 B2 | | 11/2002 | Yoshida | |
| 6,489,808 B2 | * | 12/2002 | Iizuka | 326/56 |
| 6,836,179 B2 | * | 12/2004 | Mizuno et al. | 327/544 |
| 7,042,245 B2 | * | 5/2006 | Hidaka | 326/34 |
| 7,138,825 B2 | * | 11/2006 | Kim et al. | 326/34 |
| 2004/0080340 A1 | * | 4/2004 | Hidaka | 326/83 |
| 2004/0238887 A1 | * | 12/2004 | Nihey | 257/347 |

* cited by examiner

*Primary Examiner*—Rexford Barnie
*Assistant Examiner*—Christopher Lo
(74) *Attorney, Agent, or Firm*—Maginot, Moore & Beck (57) ABSTRACT

Logic activation circuit for switching a logic circuit having at least one supply voltage line on or off, said logic activation circuit having:
(a) at least one voltage supply switching device for connecting a supply voltage to a supply voltage line of the logic circuit in a manner dependent on a changeover control signal that is applied to a control terminal of the voltage supply switching device; and having
(b) a charge equalization switching device which, in a manner dependent on a control switching pulse, connects the supply voltage line of the logic circuit to the control terminal of the voltage supply switching device for the duration of the control switching pulse so that charge equalization is effected between the supply voltage line and the control terminal of the voltage supply switching device in order to generate the changeover control signal.

22 Claims, 8 Drawing Sheets

FIG 8

LOGIC ACTIVATION CIRCUIT

FIELD OF THE INVENTION

The invention relates to a logic activation circuit for activating any desired logic circuits.

BACKGROUND

Figure 1:
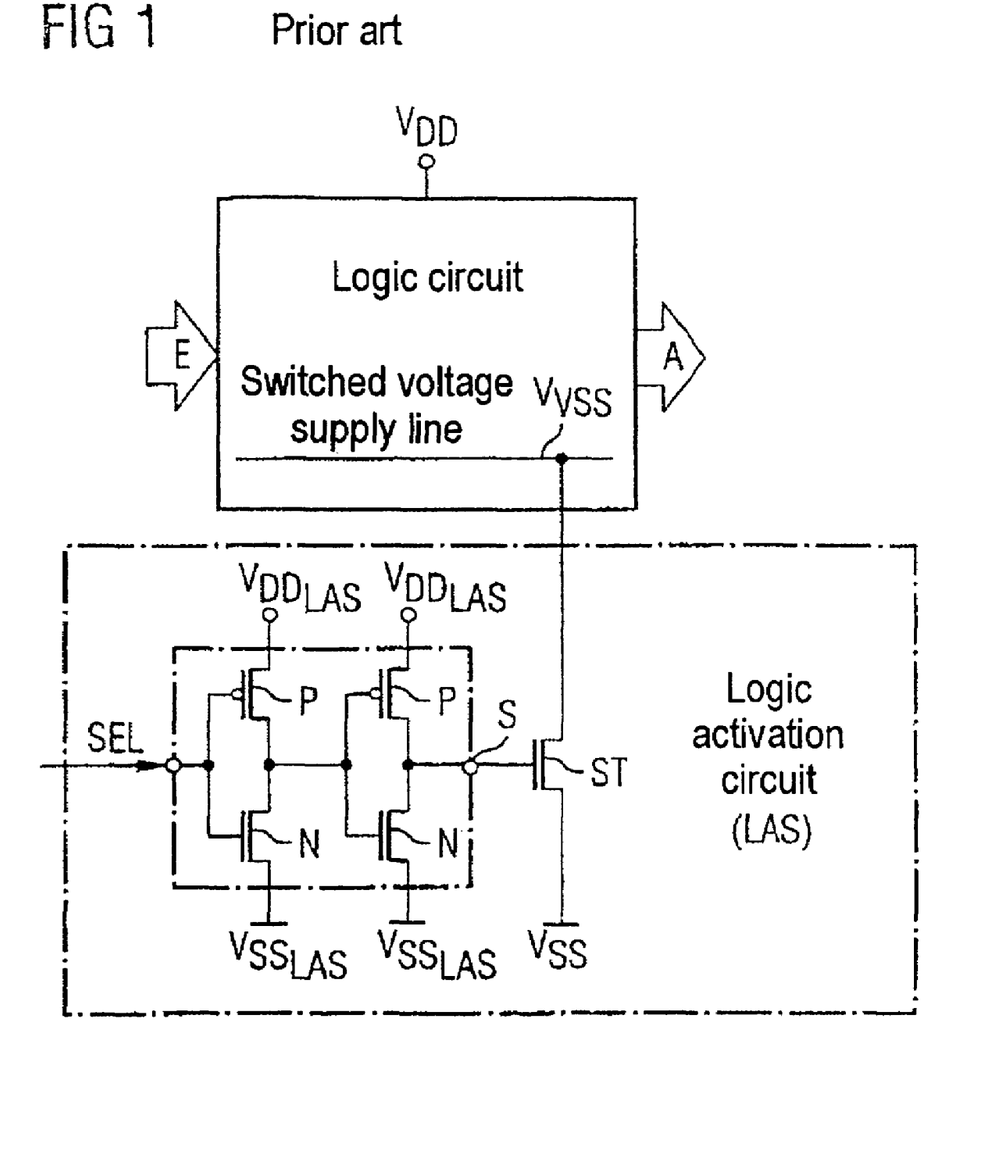
FIG. 1 shows a logic activation circuit in accordance with the prior art.

FIG. 1 shows a logic activation circuit in accordance with the prior art for activating a logic circuit which contains at least one integrated supply voltage line. The logic circuit receives logic input signals E and emits processed logic signals A on output lines. The logic activation circuit in accordance with the prior art (as illustrated in FIG. 1) activates the logic circuit by using a voltage supply switching device or a switching transistor ST to connect a virtual or switched negative supply voltage line ($V_{VSS}$) to a negative supply circuit $V_{SS}$. After the switching transistor ST has been switched on, the positive supply voltage $V_{DD}$ and the negative supply voltage $V_{SS}$ are applied to the logic circuit, the voltage difference between the two supply voltage potentials being 1 V, for example.

The switching transistor ST in the conventional logic activation circuit in accordance with the prior art is driven using buffer circuits which are connected in series. The buffer circuits each contain two complementary MOSFETs P, N, the gate terminals of which are connected together and are connected to the output node of the preceding buffer circuit. The first buffer circuit is driven using a selection signal SEL. The buffer circuits are supplied with the positive supply voltage $V_{DD\ Buffer}$ and with the negative supply voltage $V_{SS\ Buffer}$.

In the example illustrated in FIG. 1, a logic high drive signal SEL gives rise to a logic high potential at the control node S or gate of the switching transistor ST. On account of the high potential at the control terminal S of the switching transistor ST, the NMOS switching transistor ST is switched on and the virtual voltage supply line $V_{VSS}$ is thus pulled to the negative voltage potential $V_{SS}$, with the result that the logic circuit is switched on. Alternatively, the switching transistor ST is provided between the positive supply voltage $V_{DD}$ and a virtual positive supply voltage line $V_{VDD}$ of the logic circuit.

A principal drawback of the logic activation circuit in accordance with the prior art (as illustrated in FIG. 1) is that, when generating the changeover control signal at the control terminal S of the switching transistor ST, a charge Q is drawn from the supply voltage potential $V_{DD}$ via the PMOS transistor (which is switched on) in the last buffer circuit. This means that the supply voltage is loaded with the charge Q flowing to the control terminal S. In particular, if the logic circuit is in a mobile terminal and the logic circuit is thus supplied using a battery, this severely shortens the standby times or operating times of the mobile terminal. However, the load on the voltage supply source $V_{DD}$ is also disadvantageous in devices which are not mobile since, as a result of reversing the charge, energy is drawn from the voltage supply source, which leads to heating. In large scale integrated circuits, in particular, this can lead to major problems which can usually only be overcome using complex cooling devices.

In many applications, the logic circuit illustrated in FIG. 1 is switched off using the logic activation circuit in order to save energy. The conventional logic activation circuit (as illustrated in FIG. 1) uses so much energy that it is worthwhile switching off the logic circuit only for relatively long switch-off times, that is to say if the energy saved by switching off the logic circuit is higher than the energy used by the logic activation circuit. In many cases, the minimum switch-off time, as of which it is worthwhile switching off the logic circuit, is too long on account of the large amount of energy used by the logic activation circuit.

The increasing miniaturization in integrated logic circuits and the resultant increased leakage current increase the power loss and thus reduce the available operating times and increase the standby power of integrated logic circuits of this type. In high-performance applications, the proportion of leakage current in the total power loss is up to 50%. Although the proportion of leakage current is considerably smaller in mobile low-power systems, reducing the leakage current constitutes an important design task as regards a long service life of the mobile terminal.

In order to effectively reduce both subthreshold currents and gate tunnel currents in the MOSFET transistors which are connected in the logic circuit, it is expedient to use the switching transistor ST in the logic activation circuit to switch off a logic circuit block that is currently not required. The leakage current within the logic circuit does not dip immediately after the logic circuit has been switched off but rather approaches a particular residual leakage current over a particular period of time. This profile is described, to a good approximation, by an exponential decay. On the other hand, the operation of driving the logic activation circuit requires additional energy which is largely needed to charge the gate capacitance of the switching transistor ST. This gate capacitance is generally very high since the switching transistor or cut-off switch has a very wide channel width in comparison with the logic transistors provided in the logic circuit. The switching transistor is designed to have a very wide channel width in order to keep the delay degradation of the logic circuit small in the active state, said delay degradation being caused by the finitely high on-resistance of the switching transistor.

For the abovementioned reasons, it is not possible to switch off the logic circuit for any desired short interval of time. On the one hand, the maximum potential saving, that is to say the minimum residual leakage current, is established only after a certain amount of time and, on the other hand, the energy used to drive the switching transistor ST and to drive the switch-off logic unit must be compensated for before a saving in energy noticeably occurs on the outside.

SUMMARY

Therefore, the object of the present invention is to provide a logic activation circuit for switching a logic circuit on or off, which logic activation circuit switches the logic circuit on or off using a minimal amount of energy.

This object is achieved by a logic activation circuit having according to the invention.

The invention provides a logic activation circuit for switching a logic circuit having at least one supply voltage line on or off, said logic activation circuit having:

(a) at least one voltage supply switching device for connecting a supply voltage to a supply voltage line of the logic circuit in a manner dependent on a changeover control signal that is applied to a control terminal of the voltage supply switching device; and having (b) a charge equalization switching device which, in a manner dependent on a control switching pulse, connects the supply voltage line of the logic circuit to the control terminal of the voltage supply switching device for the duration of the control switching pulse so that charge equalization is effected between the supply voltage line of the logic circuit and the control terminal of the voltage supply switching device in order to generate the changeover control signal.

In a preferred embodiment of the logic activation circuit according to the invention, provision is made of a buffer circuit which retains the signal level of the changeover control signal, after the control switching pulse has ended, in order to maintain the switching state of the voltage supply switching device.

In a preferred embodiment, the buffer circuit contains two complementary transistors which are connected in series between a positive supply voltage and a negative supply voltage at an output node of the buffer circuit.

In a preferred embodiment, the output node of the buffer circuit is directly connected to the control terminal of the voltage supply switching device.

In a preferred embodiment, the two complementary transistors in the buffer circuit each have control terminals for applying drive signals.

In a preferred embodiment, provision is made of a control signal generation circuit which generates the drive signals for the transistors in the buffer circuit and the control switching pulse for the charge equalization switching device in a manner dependent on an external selection signal for selecting the logic activation circuit.

In a preferred embodiment, the output impedance at the output node of the buffer circuit is switched to high by means of the drive signals for the duration of the control switching pulse.

In a preferred embodiment, the voltage supply switching device is formed by a MOSFET.

In a preferred embodiment, the charge equalization switching device comprises two transistors which are of complementary design and are connected in parallel.

In a preferred embodiment, the transistors in the charge equalization switching device are MOSFETs.

In a preferred embodiment of the logic activation circuit according to the invention, the control switching pulse is applied to the gate of a first MOSFET in the charge equalization switching device, and the inverted control switching pulse is applied to the gate of the second MOSFET in the charge equalization switching device.

In a preferred embodiment of the logic activation circuit according to the invention, the charge equalization switching device comprises carbo-nano tubes.

In a preferred embodiment, the duration of the control switching pulse is shorter than the charging time for reversing the charge of the supply voltage line when the voltage supply switching device is switched on.

In a preferred embodiment, the charging time for reversing the charge of the supply voltage line depends on an effective on-resistance of the voltage supply switching device and on the capacitance of the supply voltage line of the logic circuit.

In a preferred embodiment, the duration of the control switching pulse is longer than the charging time for reversing the charge of the control terminal of the voltage supply switching device.

In a preferred embodiment, the charging time for reversing the charge of the control terminal depends on the effective on-resistance of the charge equalization switching device and on the capacitance of the control terminal.

In a preferred embodiment, the logic circuit has two supply voltage lines.

In a preferred embodiment, the logic circuit and the logic activation circuit are integrated on a chip.

The invention also provides a method for switching at least one logic circuit—which respectively has at least one supply voltage line—on or off using a voltage supply switching device that is connected by the supply voltage line, a changeover control signal for switching the voltage supply switching device being generated by means of charge equalization at a control terminal of the voltage supply switching device.

In a preferred embodiment of the method according to the invention, charge equalization is effected at the control terminal of the voltage supply switching device using a charge equalization switching device.

In a preferred embodiment of the method according to the invention, the charge equalization switching device is driven by a control switching pulse for switching on the charge equalization switching device.

In this case, charge equalization is preferably effected at the control terminal using the charge equalization switching device which is switched on.

In a first embodiment, charge equalization is effected in this case between the supply line of the logic circuit and the control terminal of the voltage supply switching device.

In a second alternative embodiment, charge equalization is effected between two control terminals of two voltage supply switching devices which are provided for two logic circuits which are connected in series.

Preferred embodiments of the logic activation circuit according to the invention and of the method according to the invention are described below with reference to the accompanying figures in order to explain features which are essential to the invention.

DETAILED DESCRIPTION

Figure 2:
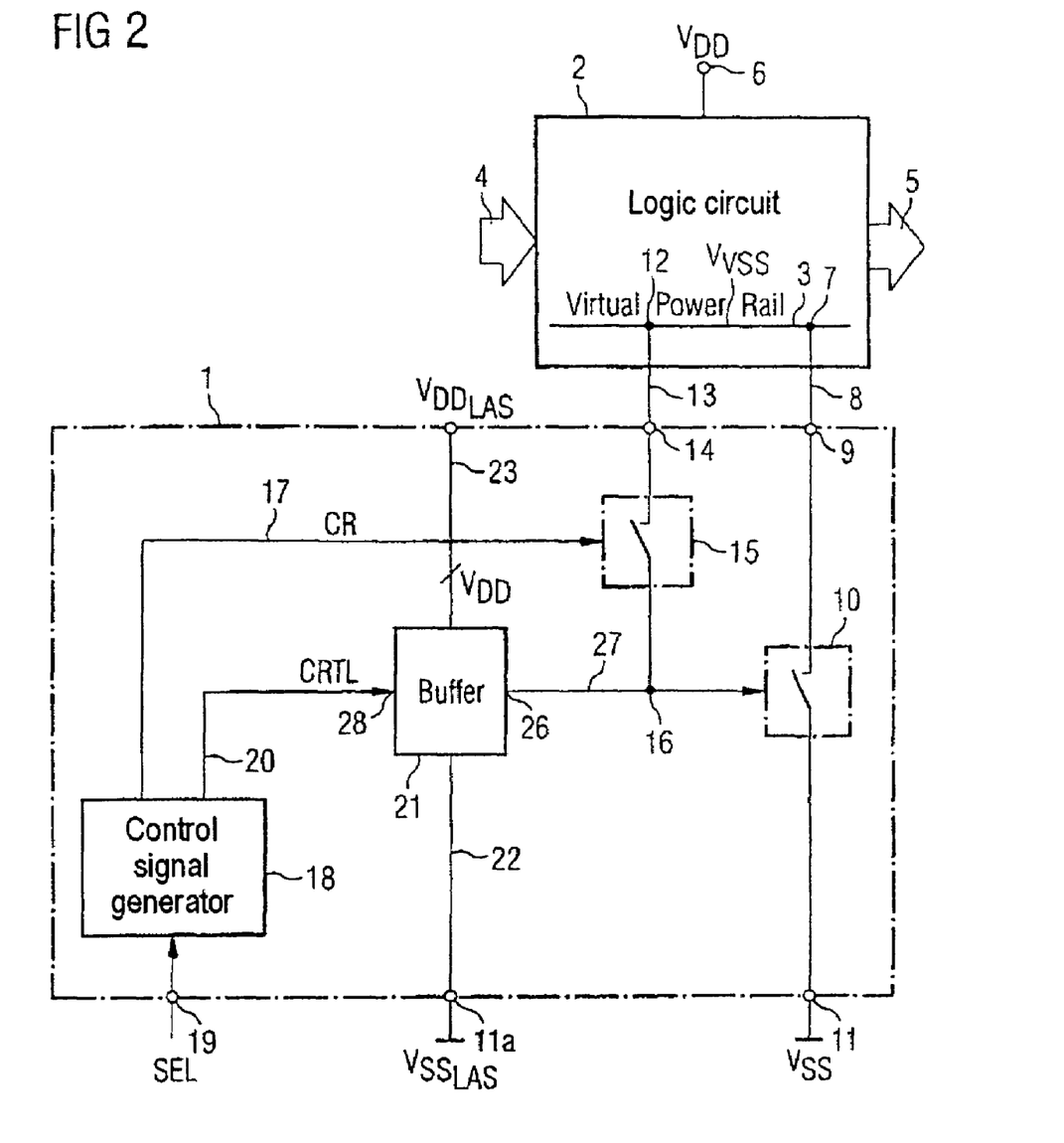
FIG. 2 shows a logic activation circuit in accordance with the invention.

FIG. 2 shows a first embodiment of the logic activation circuit 1 according to the invention. The logic activation circuit 1 is used to switch a logic circuit 2 containing at least one supply voltage line 3 on or off. The logic circuit 2 receives logic input signals via input lines 4 and processes said input signals. The processed output signals from the logic circuit 2 are emitted, via output lines 5, for further processing. The logic circuit 2 has a first supply voltage terminal 6 for applying a positive supply voltage $V_{DD}$.

The integrated supply voltage line 3 is used to connect a negative supply voltage $V_{SS}$. The supply voltage line 3 forms a virtual supply voltage line (virtual power rail). At a first branching-off node 7 of the supply voltage line 3, the supply voltage line 3 is connected to a terminal 9 of the logic activation circuit 1 via a line 8. The terminal 9 is connected, via a voltage supply switching device 10 within the logic activation circuit 1, to a supply voltage terminal 11 to which the negative supply voltage $V_{SS}$ is applied. At a further branching-off node 12, the virtual supply voltage line 3 within the logic circuit 2 is connected to a further terminal 14 of the logic activation circuit 1 via a line 13. Connected to the terminal 14 is a charge equalization circuit 15 which, when in the switched-on state, connects the terminal 14 to a control node or a control terminal 16 for driving the voltage supply switching device 10. The voltage supply switching device 10 connects the negative supply voltage $V_{SS}$ to the virtual supply voltage line 3 within the logic circuit 2 in a manner dependent on a changeover control signal that is applied to the control terminal 16. In a manner dependent on an applied control switching pulse CR, the charge equalization switching device 15 connects the virtual supply voltage line 3 of the logic circuit 2 to the control terminal 16 of the voltage supply switching device 10 for the duration of the control switching pulse. The charge equalization switching device 15 receives the control switching pulse CR, via a control line 17, from a control signal generator 18 which is preferably integrated within the logic activation circuit 1.

The control signal generator 18 receives, via a control terminal 19 of the logic activation circuit 1, an external selection signal for selecting the logic activation circuit 1. As soon as the control signal generator 18 receives the selection signal SEL, it generates drive signals (which are emitted, via at least one control signal line 20, to a buffer circuit 21 that is integrated in the logic activation circuit 1) as well as the control switching pulse CR for the charge equalization switching device 15. The buffer circuit 21 is provided for the purpose of reconstructing and maintaining the signal level of the changeover control signal at the control terminal 16 when the control switching pulse ends so that the switching state of the voltage supply switching device 10 is retained after the control switching pulse has decayed. The buffer circuit 21 is supplied with the positive supply voltage $V_{DD\_LAS}$ and with the negative supply voltage $V_{SS\_LAS}$. To this end, the buffer circuit 21 is connected to a negative supply voltage terminal 11a of the logic activation circuit 1 via a line 22. In addition, the buffer circuit 21 is connected to a positive supply voltage terminal 24 of the logic activation circuit 1 via a line 23.

Figure 3:
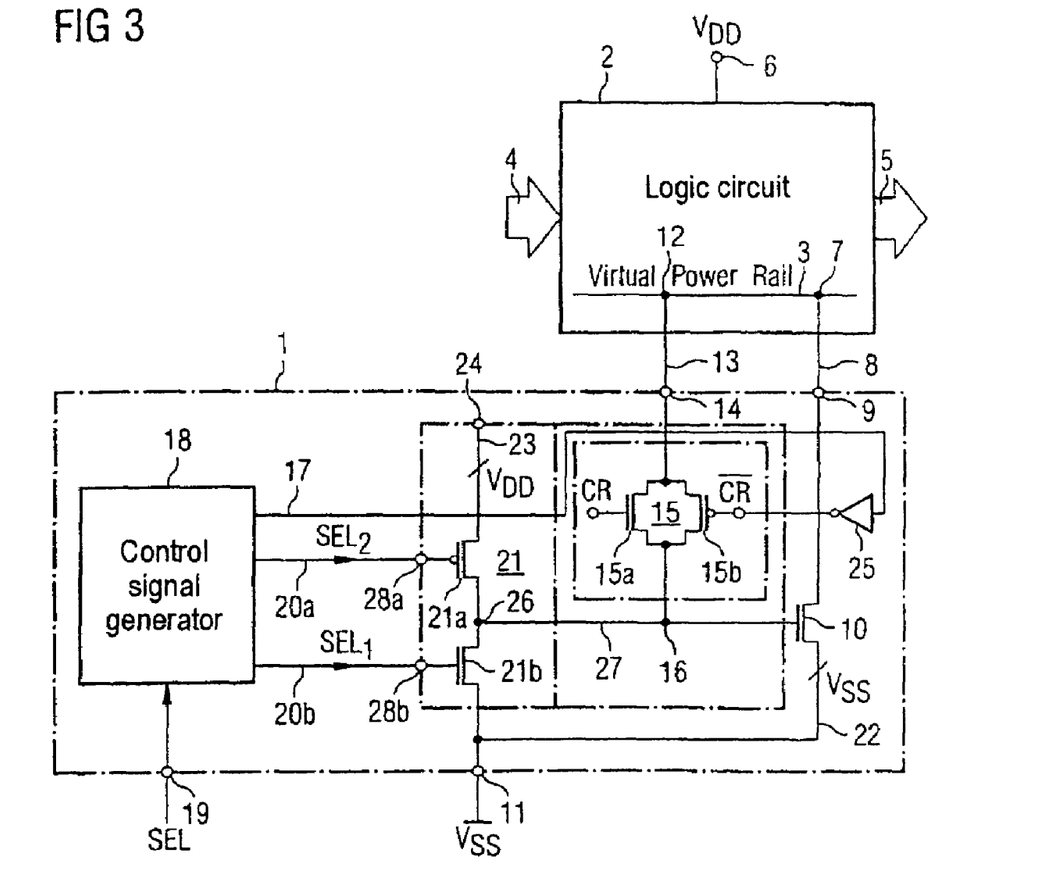
FIG. 3 shows another embodiment of the logic activation circuit according to the invention.

FIG. 3 shows a preferred embodiment of the logic activation circuit 1 according to the invention, in which the voltage supply switching device 10 is formed by an NMOS transistor and the charge equalization switching device 15 is formed by a transmission gate.

In this case, the charge equalization switching device 15 comprises two transistors 15a, 15b which are of complementary design and are connected in parallel, the first MOSFET 15a being formed by an NMOS transistor and the second MOSFET 15b being formed by a PMOS transistor in the example shown. The NMOS transistor 15a of the transmission gate 15 receives the control switching pulse CR from the control signal generator 18 via the control line 17. The PMOS transistor 15b of the transmission gate receives the control switching pulse that has been inverted by an inverter 25.

In the preferred embodiment illustrated in FIG. 3, the buffer circuit 21 contains two MOSFET transistors of complementary design, namely a PMOS transistor 21a and an NMOS transistor 21b. The two MOSFET transistors in the buffer circuit 21 are connected in series at an output node 26 of the buffer circuit 21. The output node 26 of the buffer circuit 21 is connected to the control terminal 16 of the voltage supply switching device 10 via a line 27. The two complementary transistors 21a, 21b in the buffer circuit 21 each have control terminals 28a, 28b which receive drive signals $SEL_2$, $SEL_1$ from the control signal generator 18 via the control lines 20a, 20b.

Figure 4:
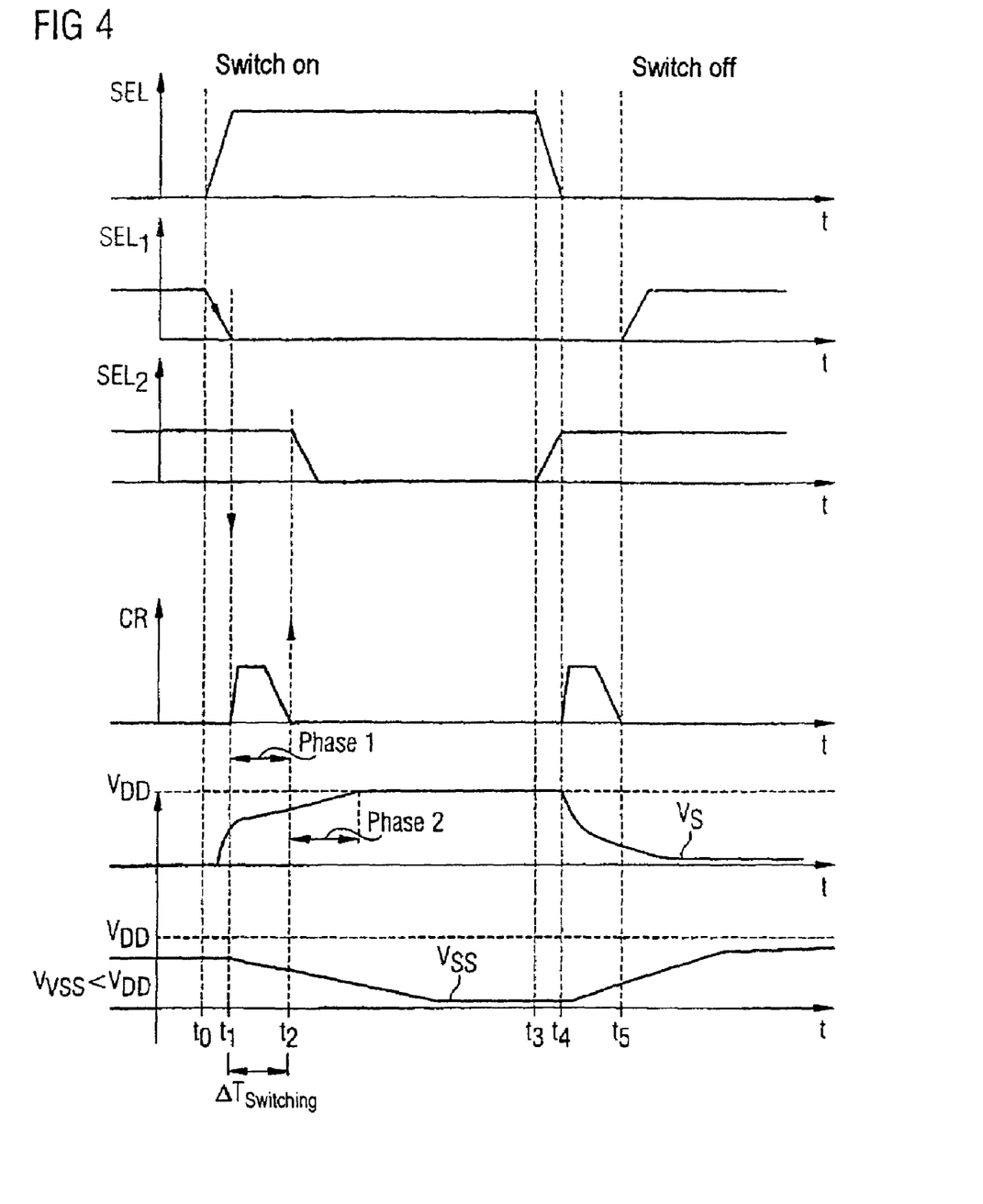
FIG. 4 shows signal timing diagrams for explaining the method of operation of the logic activation circuit according to the invention.

The method of operation of the inventive logic activation circuit 1 (as illustrated in FIGS. 2, 3) will be explained in detail below with reference to FIG. 4.

The control signal generator 18 receives an external selection signal SEL and deactivates the NMOS transistor 21b in the buffer circuit 21 using a falling signal edge of the drive signal $SEL_1$ at time $t_0$. At time $t_1$, the NMOS transistor 21b is completely switched off. If, at time $t_1$, the PMOS transistor 21a in the buffer circuit 21 is still off on account of the high level of the second drive signal $SEL_2$, the output impedance at the output node 26 of the buffer circuit 21 is high at time $t_1$. As soon as the NMOS transistor 21b has been switched off and the output impedance of the buffer circuit 21 is thus high, the control signal generator 18 emits a control signal pulse CR, via the control line 17, to the charge equalization switching device 15 in order to switch on the latter. For the duration of the control switching pulse CR, that is to say between times $t_1$, $t_2$, the charge equalization switching device 15 is switched on and connects the virtual voltage supply line 3 to the control terminal 16 of the voltage supply switching device 10. On account of the leakage currents which flow from the positive voltage supply terminal 6 to the virtual voltage supply line 3 within the logic circuit 2 during the switched-off state, there is a relatively large positive charge Q on the supply voltage line 3. The charge Q on the virtual supply voltage line 3 of the logic circuit 2 is particularly large, inter alia, because the capacitance of the virtual power rail 3 is large. The reason for this is that the VSS power system of the logic circuit and the sum of all of the capacitances which are present at the source terminals of all of the N-channel MOSFETs within the logic circuit 2 contribute to the capacitance of the virtual voltage supply line 3. When the logic circuit 2 is in the switched-off state, there is thus a large amount of charge Q on the virtual supply voltage line 3 in the case of a voltage potential close to the positive supply voltage $V_{DD}$. When the charge equalization switching device 15 is switched on with the switching duration $\Delta T_{switching}$, the positive charge Q on the virtual supply voltage line 3 flows toward the control terminal 16, as can be seen in FIG. 4. During this switching phase, the control terminal 16 is charged exponentially in an asymptotic manner and the voltage on the virtual supply voltage line 3 falls.

The duration $\Delta T_{switching}$ of the control switching pulse CR is selected to be shorter than the charge reversal time for reversing the charge of the supply voltage line 3 when the voltage supply switching device 10 is switched on.

In this case, the charge reversal time for reversing the charge of the supply voltage line 3 is given by the product of the effective on-resistance of the voltage supply switching device 10 and the capacitance of the supply voltage line 3:

$$\Delta T_{switching} < R_{ONEFF10} \cdot C_{VVSS3} \quad (1)$$

The duration $\Delta T_{switching}$ of the control switching pulse CR generated by the control signal generator 18 is selected to be longer than the charge reversal time for reversing the charge of the control terminal of the voltage supply switching device 10.

In this case, the charge reversal time for reversing the charge of the control terminal 16 results from the product of the effective on-resistance of the charge equalization switching device 15 and the capacitance of the control terminal 16:

$$\Delta T_{switching} > R_{ONEFF10} \cdot C_{16} \quad (2)$$

The duration of the switching pulse $\Delta T_{switching}$ is sufficient to give rise to extensive charge equalization between the virtual supply voltage line 3 and the control terminal 16. Charge equalization results in the voltage potential at the control terminal 16 increasing, with the result that the voltage supply switching device 10 which is formed by an NMOS transistor switches on.

The voltage supply switching device 10 which is switched on pulls the supply voltage line 3 to the negative supply voltage potential $V_{SS}$ relatively quickly. So that the control terminal 16 is not pulled back to the negative supply voltage potential $V_{SS}$ as well, the charge equalization switching device 15 is switched off at time $t_2$, with the result that no further charge equalization is effected.

In order to maintain the positive signal level of the changeover control signal at the control terminal 16 after the control switching pulse CR has ended, the buffer circuit 21 is activated by means of the drive signals from the control signal generator 18. To this end, the control signal SEL2 for the PMOS transistor 21a has a negative signal edge at time $t_2$, with the result that the PMOS transistor 21a connects the positive supply voltage $V_{DD}$ (which is applied to the terminal 24) to the control terminal 16. This causes the voltage at the control terminal 16 to rise to close to the positive supply voltage $V_{DD}$ in a further switch-on phase. The buffer circuit 21 thus causes the switching state of the voltage supply switching device 10 to be regenerated and retained after the charge equalization switching device 15 has been deactivated. As soon as the voltage supply switching device 10 has been switched on and the capacitance of the virtual power rail 3 has been discharged to $V_{SS}$, the logic circuit 2 is activated.

At time $t_3$, the control signal generator 18 receives a negative edge of the selection signal SEL in order to deactivate the logic circuit 2. The control signal generator 18 applies a positive signal edge to the control terminal 28a of the PMOS transistor 21a in order to switch off the latter at time $t_4$.

Since, at time $t_4$, the NMOS transistor 21b is also deactivated on account of the logic low drive signal $SEL_1$, the output impedance of the buffer circuit 21 is high at time $t_4$. The control signal generator 18 then applies a brief control signal pulse CR to the charge equalization switching device 15 via the control line 17, with the result that the positive charge that is applied to the control signal terminal 16 flows away, via the charge equalization circuit 15, into the virtual voltage supply line 3 that is at the negative supply voltage potential $V_{SS}$ at this time. The voltage at the control terminal 16 then decays exponentially, with the result that the NMOS transistor 10 closes and the virtual voltage supply circuit 3 is isolated from the negative supply voltage terminal 11.

So that the switching state of the NMOS transistor 10 is retained, the control signal generator 18 switches on the NMOS transistor 21b in the buffer circuit 21 at time $t_5$ via the control line 20b. As soon as the NMOS transistor 10 has been switched off, the logic circuit 2 is in the deactivated state.

The logic activation circuit 1 according to the invention does not shorten the restart time but rather reduces the energy overload in order to thereby achieve a shortened minimum switch-off time $T_{min}$ as of which it is worthwhile switching off the logic circuit 2 despite the energy used by the activation circuit 1. The activation circuit 1 according to the invention uses the virtual voltage supply line 3 as a charge source when switching on the switching transistor 10 and as a charge drain when switching off the switching transistor 10. If the logic circuit 2 is switched off, all of the internal nodes of the logic circuit 2 as well as the virtual power rail 3 are charged to a voltage potential which is close to the operating potential that has not been switched. On account of the high capacitance of the virtual voltage supply line 3, a large amount of charge Q is available given a potential close to the positive supply voltage $V_{DD}$ if the negative supply voltage $V_{SS}$ is connected to the virtual voltage supply line 3. This large amount of charge Q is used to turn on the switching transistor 10.

The buffer circuit 21 provided in the activation circuit 1 according to the invention preferably contains MOSFET transistors 21a, 21b each having a relatively narrow channel width since the buffer circuit 21 is provided only to retain the signal level at the control terminal 16.

The charge Q flowing via the charge equalization switching device 15 when the supply voltage switching device 10 is changed over is not taken from the supply voltage $V_{DD}$, with the result that the load on the supply voltage source is considerably lower than in the case of a conventional logic activation circuit, as illustrated in FIG. 1. This considerably increases the standby times, in particular in mobile terminals which are operated with a battery. When switching on the logic circuit 2, the necessary charge Q is taken from the virtual power rail 3 and, when switching off the logic circuit 2, this charge is returned to the virtual power rail 3 again. This reduces the charge Q that is drawn from the voltage source as a result of leakage currents in the switched-off state.

In the embodiment illustrated in FIG. 3, the voltage supply switching device 10 and the charge equalization switching device 15 are formed by MOSFET transistors. In an alternative embodiment, the charge equalization switching device 15 is formed at least by a so-called carbo-nano tube.

Figure 5:
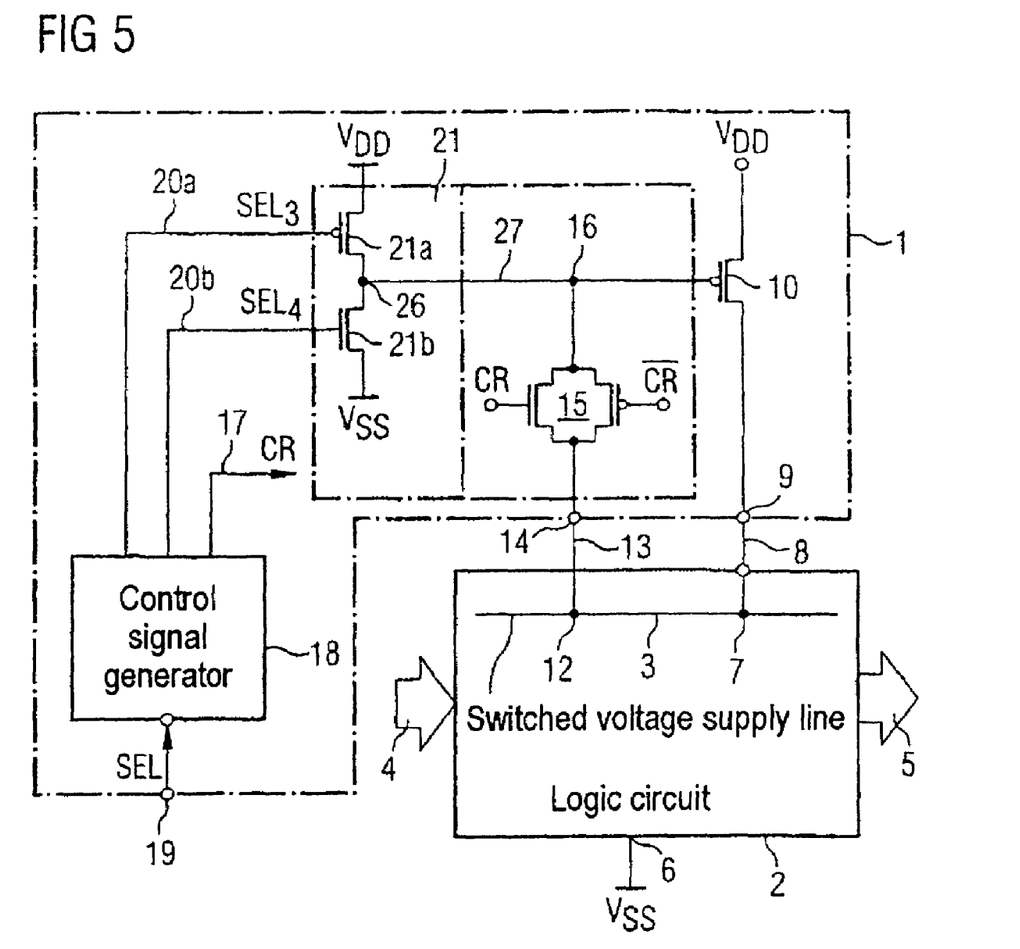
FIG. 5 shows another embodiment of the logic activation circuit according to the invention.

FIG. 5 shows an alternative second embodiment of the logic activation circuit 1 according to the invention, in which a logic activation circuit 1 is connected to the positive virtual voltage supply line and not to the negative virtual voltage supply line 3 (as in the first embodiment illustrated in FIG. 3) within the logic circuit 2. For the rest, the method of operation of the logic activation circuit 1 illustrated in FIG. 5 is identical to the method of operation in accordance with the embodiment illustrated in FIG. 3.

FIG. 6 is used to explain the method of operation of the logic activation circuit 1 according to the invention.

At time $t_a$, the logic circuit 2 is switched off by the logic activation circuit 1 according to the invention, with the result that the power loss caused by leakage current falls exponentially within the logic circuit 2. Operating the logic activation circuit 1 gives rise to a power loss in the drive circuit 1 at time $t_a$ when switching off the logic circuit 2.

At time $t_b$, the logic circuit 2 is switched on again, with the result that the power loss rises to the high 20 value $P_{ON}$ within the logic circuit 2. The activated logic activation circuit 1 gives rise to a power loss in the drive circuit 1.

Figure 6A:
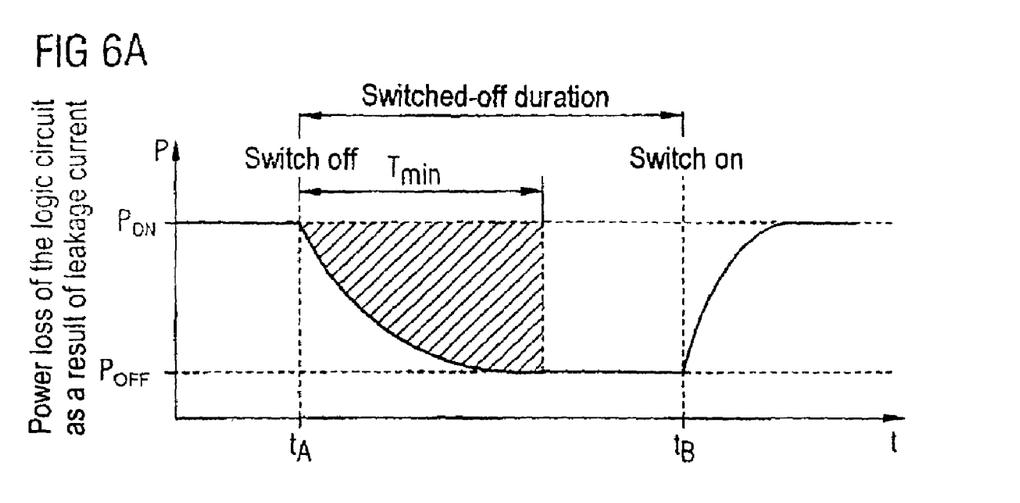
FIG. 6 shows diagrams for explaining the method of operation of the logic activation circuit according to the invention.

As can be seen from FIG. 6a, power loss is reduced overall only after a minimum switch-off time $T_{min}$. The area that is illustrated in hatched form in FIG. 6a corresponds to the sum of the two areas illustrated in hatched form in FIG. 6b. If the switched-off duration is shorter than the time $T_{min}$, the power loss is not reduced but rather, on the contrary, even additional energy is used. If the switched-off duration of the logic circuit 2 is longer than this minimum time $T_{min}$, energy is saved overall.

Figure 6B:
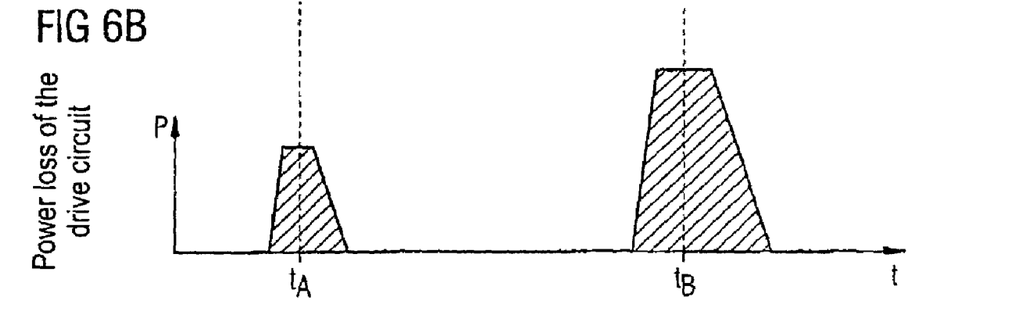

Since the power loss of the drive circuit 1 according to the invention is relatively low on account of charge equalization and the areas illustrated in hatched form in FIG. 6b are thus also relatively small, the minimum switch-off time $T_{min}$ is consequently also short in the case of the logic activation circuit 1 according to the invention.

Figure 7:
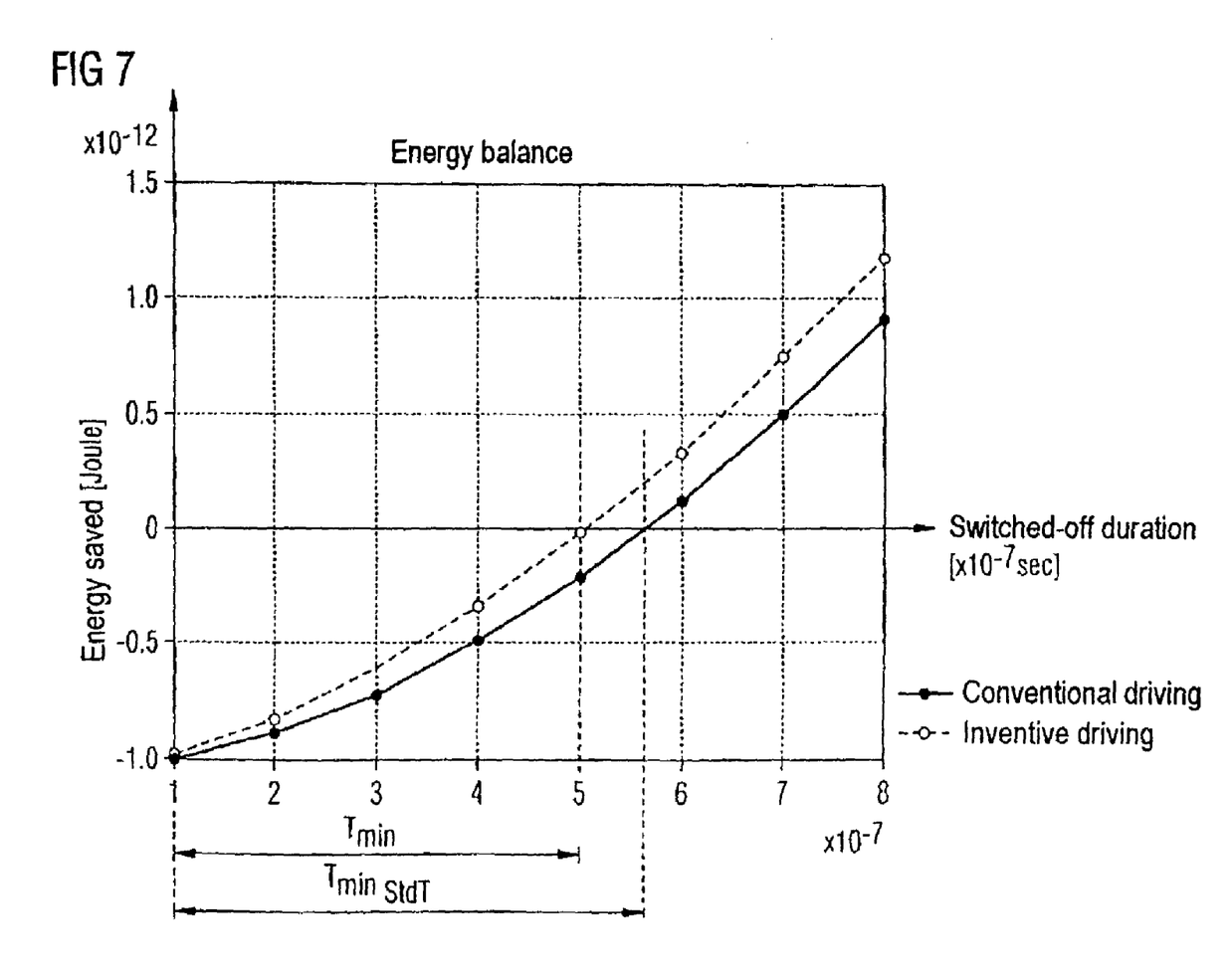
FIG. 7 shows a diagram of the energy balance in the logic activation circuit according to the invention in comparison with a conventional logic activation circuit in accordance with the prior art.

FIG. 7 shows the energy balance in the logic drive circuit 1 according to the invention in comparison with a conventional logic drive circuit as illustrated in FIG. 1. As can be seen, the minimum switch-off time as of which it is worthwhile switching off the logic circuit 2 falls considerably on account of the energy saving. When the switch-off time is the same, the energy saved increases in the activation circuit 1 according to the invention in comparison with the conventional activation circuit.

Figure 8:
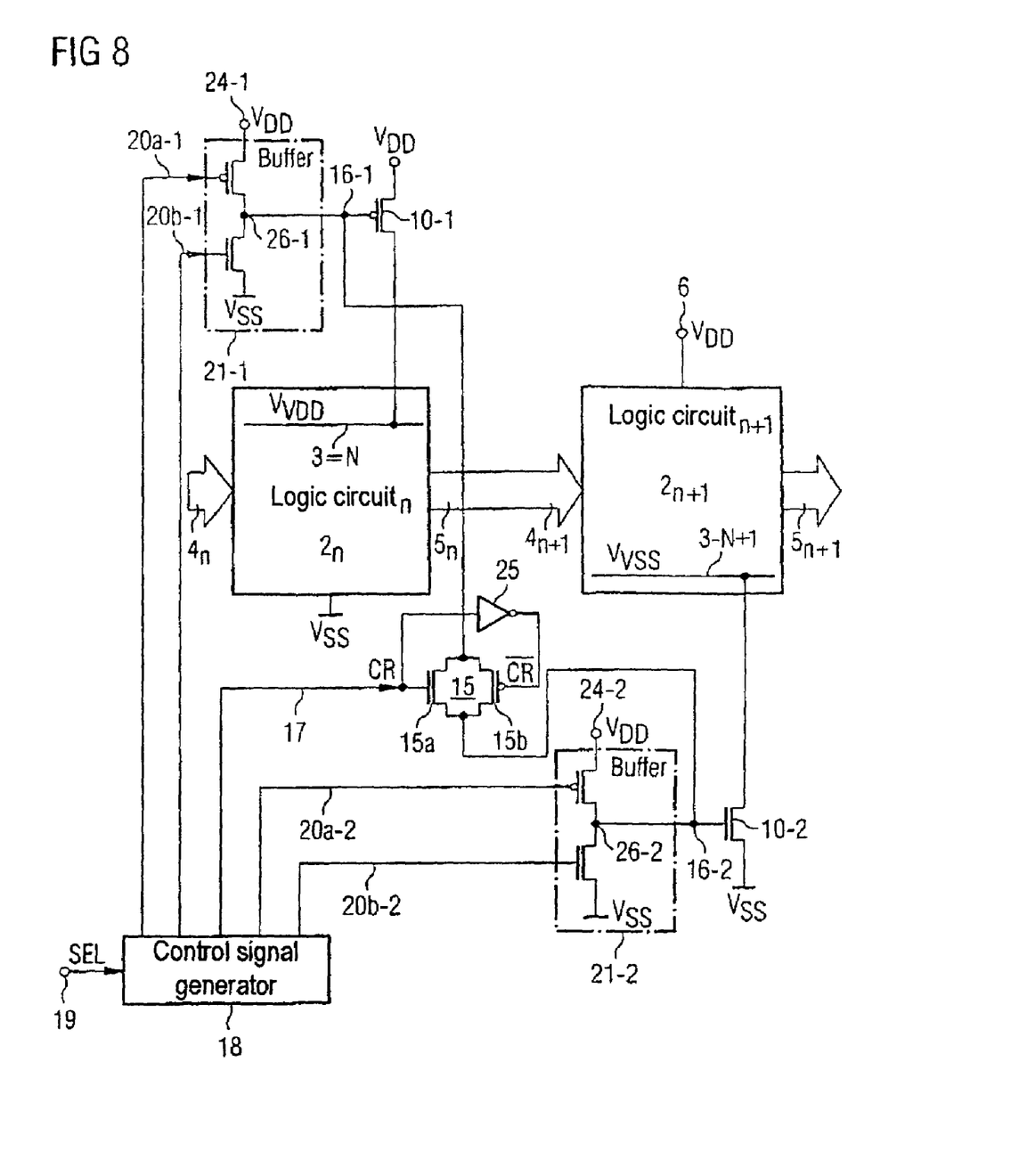
FIG. 8 shows another embodiment of the logic activation circuit according to the invention.

FIG. 8 shows a further embodiment of the inventive logic activation circuit 1 for switching logic circuits on or off.

In the embodiment illustrated in FIG. 8, a plurality of logic circuits 2 are connected in series. In this case, a logic circuit $2_{n+1}$ processes the processed output signals from the preceding logic circuit $2_n$, which signals are applied on the input side. The two logic circuits 2 which are connected in series have complementary virtual voltage supply lines 3-$n$ and 3-$n$+1.

In the example illustrated in FIG. 8, the logic circuit 2$n$ has a positive virtual supply voltage line 3-$n$ which again can be connected to a positive supply voltage $V_{DD}$ via a voltage supply switching device 10-1. The downstream logic circuit $2_{n+1}$ has a negative virtual voltage supply line 3-$n$+1 which can be connected to a negative supply voltage $V_{SS}$ via a further voltage supply switching device 10-2. The complementary voltage supply switching devices 10-1, 10-2 have control terminals 16-1, 16-2 which are connected to output nodes 26-1, 26-2 of the buffer circuits 21-1, 21-2. The MOSFETs in the buffer circuits 21-1, 21-2 are driven by the control signal generator 18 via control lines. The logic activation circuits for activating the logic circuits 2-$n$, 2-$n$+1 are arranged in a so-called zigzag pattern.

In order to activate or switch on the two series-connected logic circuits 2-$n$, 2-$n$+1, the output nodes of the two buffer circuits 21-1, 21-2 are first of all switched to high impedance and the charge equalization switching device 15 is then switched on by means of a short switching pulse CR. Before the voltage supply switching device 10-1 is switched on, there is a positive charge at the control terminal node 16-1 and, before the voltage supply switching device 10-2 is switched on, there is a negative charge at the control terminal 16-2. After the switching device 15 has been switched on, charge equalization is effected, with the result that the voltage potential at the control terminal 16-1 falls and the voltage potential at the control node 16-2 rises. This leads to the two voltage supply switching devices 10-1, 10-2 being switched on, with the result that the two series-connected logic circuits 2-$n$, 2-$n$+1 are activated. After the voltage supply switching devices 10-1, 10-2 have been switched on, the signal levels at the control terminals 16-1, 16-2 are regenerated and retained by means of the buffer circuits 21-1, 21-2.

LIST OF REFERENCE SYMBOLS

1 Logic activation circuit
2 Logic circuit
3 Virtual voltage supply line
4 Signal lines
5 Signal lines
6 Supply voltage terminal
7 Branching-off node
8 Line
9 Terminal
10 Voltage supply switching device
11 Supply voltage terminal
12 Branching-off node
13 Line
14 Terminal
15 Charge equalization circuit
16 Control terminal
17 Control line
18 Control signal generator
19 Control terminal
20 Control lines
21 Buffer circuit
22 Line
23 Line
24 Supply voltage terminal
25 Inverter
26 Output node
27 Line
28 Control terminal

The invention claimed is:

1. A logic activation circuit for switching a supply voltage line of a logic circuit between an on state and an off state, said logic activation circuit comprising:
   (a) a first switching device configured to controllably connect a supply voltage to the supply voltage line in a manner dependent on a changeover control signal that is applied to a control terminal of the first switching device; and
   (b) a second switching device configured to, in a manner dependent on a control switching pulse, connect the supply voltage line of the logic circuit to the control terminal of the first switching device for a predefined duration;
   wherein the predefined duration is approximately the duration of the control switching pulse, the duration of the control switching pulse being shorter than a charge reversal time for reversing the charge of the supply voltage line when the first switching device is switched on.

2. The logic activation circuit according to claim 1, wherein the second switching device is configured to connect the supply voltage line of the logic circuit to the control terminal of the first switching device for the predefined duration to effectuate charge equalization between the supply voltage line and the control terminal of the first switching device in order to generate the changeover control signal.

3. The logic activation circuit according to claim 1, further comprising a buffer circuit configured to retain the signal level of the changeover control signal, after the control switching pulse has ended, in order to maintain the switching state of the first switching device.

4. The logic activation circuit according to claim 3, wherein the buffer circuit comprises two transistors connected in series between a positive supply voltage and a negative supply voltage at an output node of the buffer circuit.

5. The logic activation circuit according to claim 4, wherein the output node of the buffer circuit is connected to the control terminal of the first supply switching device.

6. The logic activation circuit according to claim 5, further comprising a control signal generation circuit configured to generate drive signals for the transistors in the buffer circuit and to generate the control switching pulse for the second switching device in a manner dependent on an external selection signal.

7. The logic activation circuit according to claim 6, wherein an output impedance at the output node of the buffer circuit is switched to a high state for the duration of the control switching pulse using the drive signals.

8. The logic activation circuit according to claim 1 wherein the first switching device comprises a MOSFET.

9. The logic activation circuit according to claim 1, wherein the second switching device comprises first and second transistors of complementary design and connected in parallel.

10. The logic activation circuit according to claim 9, wherein the first and second transistors of second switching device comprise MOSFETs.

11. The logic activation circuit according to claim 10, wherein the control switching pulse is applied to a gate of the first transistor and an inverted control switching pulse is applied to a gate of the second transistor.

12. The logic activation circuit according to claim 1, wherein the second switching device comprises carbo-nano tubes.

13. The logic activation circuit according to claim 1, wherein the charge reversal time for reversing the charge of the supply voltage line depends on an effective on-resistance of the first switching device and on a capacitance of the supply voltage line of the logic circuit.

14. A logic activation circuit for switching a supply voltage line of a circuit between an on state and an off state, said logic activation circuit comprising:
 (a) a first switching device configured to controllably connect a supply voltage to the supply voltage line in a manner dependent on a changeover control signal that is applied to a control terminal of the first switching device; and
 (b) a second switching device configured to, in a manner dependent on a control switching pulse, connect the supply voltage line of the logic circuit to the control terminal of the first switching device for a predefined duration;
 wherein the predefined duration is approximately the duration of the control switching pulse, and the duration of the control switching pulse is longer than a charge reversal time for reversing the charge of the control terminal of the first switching device.

15. The logic activation circuit according to claim 14, wherein the charge reversal time for reversing the charge of the control terminal depends on an effective on-resistance of the charge equalization switching device and on a capacitance of the control terminal.

16. The logic activation circuit according to claim 1, wherein the logic activation circuit is integrated onto a chip on which the logic circuit is integrated.

17. A method for switching at least one logic circuit on or off using a first switching device that is connected to a supply voltage line of the at least one logic circuit, the method comprising:
 generating a changeover control signal for switching the first switching device using charge equalization at a control terminal of the first switching device, wherein a second switching device is configured to connect the supply voltage line of the logic circuit to the control terminal of the first switching device for a predefined duration to effectuate charge equalization between the supply voltage line and the control terminal of the first switching device in order to generate the changeover control signal;
 wherein charge equalization is effected between the control terminal of the first switching device and a control terminal of the second switching device, the first switching device and the second switching device being connected to two logic circuits, the two logic circuits being connected in series.

18. The method according to claim 17, wherein the charge equalization is effected between the supply voltage line of the logic circuit and the control terminal of the first switching device.

19. A method for switching at least one logic circuit on or off using a first switching device that is connected to a supply voltage line of the at least one logic circuit, the method comprising:
 a) providing charge equalization between a control terminal of the first switching device and the supply voltage line; and
 b) generating a changeover control signal for switching the first switching device at least in part using the charge equalization, wherein a second switching device is configured to connect the supply voltage line of the logic circuit to the control terminal of the first switching device for a predefined duration to effectuate charge equalization between the supply voltage line and the control terminal of the first switching device in order to generate the changeover control signal;
 wherein charge equalization is effected between the control terminal of the first switching device and a control terminal of the second switching device, the first switching device and the second switching device being connected to two logic circuits, the two logic circuits connected in series.

20. The method according to claim 19, wherein step a) further comprises providing the charge equalization using a controllable second switching device.

21. The method according to claim 20, wherein step a) further comprises driving the second switching device with a control switching pulse to switch the second switching device.

22. The method according to claim 21, wherein step a) further comprises providing the charge equalization when the second switching device is switched on.

* * * * *